(12) United States Patent
Khalil et al.

(10) Patent No.: US 11,923,424 B2
(45) Date of Patent: Mar. 5, 2024

(54) SEMICONDUCTOR DEVICE WITH CONDUCTIVE ELEMENTS FORMED OVER DIELECTRIC LAYERS AND METHOD OF FABRICATION THEREFOR

(71) Applicant: NXP B.V., Eindhoven (NL)

(72) Inventors: Ibrahim Khalil, Gilbert, AZ (US);
Bernhard Grote, Phoenix, AZ (US);
Humayun Kabir, Gilbert, AZ (US);
Bruce McRae Green, Gilbert, AZ (US)

(73) Assignee: NXP B.V., Eindhoven (NL)

( * ) Notice: Subject to any disclaimer, the term of this patent is extended or adjusted under 35 U.S.C. 154(b) by 270 days.

(21) Appl. No.: 17/139,636

(22) Filed: Dec. 31, 2020

(65) Prior Publication Data

US 2022/0208975 A1  Jun. 30, 2022

(51) Int. Cl.
*H01L 29/40* (2006.01)
*H01L 29/06* (2006.01)
*H01L 29/20* (2006.01)
*H01L 29/205* (2006.01)
*H01L 29/66* (2006.01)
*H01L 29/78* (2006.01)

(52) U.S. Cl.
CPC ........ *H01L 29/402* (2013.01); *H01L 29/0649* (2013.01); *H01L 29/2003* (2013.01); *H01L 29/205* (2013.01); *H01L 29/404* (2013.01); *H01L 29/66462* (2013.01); *H01L 29/78* (2013.01)

(58) Field of Classification Search
CPC . H01L 29/78; H01L 29/0649; H01L 29/7786; H01L 29/404; H01L 29/66462; H01L 29/2003; H01L 29/205; H01L 29/402; H01L 29/0847; H01L 29/407; H01L 23/3171; H01L 23/3192; H01L 29/42316; H01L 29/0615; H01L 29/778; H01L 29/41725; H01L 29/4236; H01L 29/518; H01L 29/513; H01L 29/0619; H01L 29/1066
USPC ................. 257/194, 192, 76, 409, 367, 288, 257/E29.068, E29.242, E29.315, E29.255; 438/167, 285, 172, 571
See application file for complete search history.

(56) References Cited

U.S. PATENT DOCUMENTS

9,847,411 B2  12/2017  Sriram et al.
10,593,619 B1   3/2020  Khalil et al.
(Continued)

*Primary Examiner* — Mouloucoulaye Inoussa
(74) *Attorney, Agent, or Firm* — Bruce M. Green (57) ABSTRACT

An embodiment of a semiconductor device includes a semiconductor substrate, a first dielectric layer disposed over the upper surface of the semiconductor substrate, and a first current-carrying electrode and a second current-carrying electrode formed over the semiconductor substrate within openings formed in the first dielectric layer. A control electrode is formed over the semiconductor substrate and disposed between the first current-carrying electrode and a second current-carrying electrode and over the first dielectric layer. A first conductive element is formed over the first dielectric layer, adjacent the control electrode and between the control electrode and the second current-carrying electrode. A second dielectric layer is disposed over the control electrode and over the first conductive element. A second conductive element is disposed over the second dielectric layer and over the first conductive element.

17 Claims, 8 Drawing Sheets

(56) References Cited

U.S. PATENT DOCUMENTS

| | | | |
|---|---|---|---|
| 2005/0253168 A1* | 11/2005 | Wu | H01L 29/812 |
| | | | 257/E29.253 |
| 2009/0230429 A1* | 9/2009 | Miyamoto | H01L 29/402 |
| | | | 257/192 |
| 2009/0230430 A1* | 9/2009 | Miyamoto | H01L 29/802 |
| | | | 257/192 |
| 2012/0018735 A1* | 1/2012 | Ishii | H01L 29/66431 |
| | | | 257/E29.242 |
| 2012/0126287 A1* | 5/2012 | Aoki | H01L 29/7787 |
| | | | 257/192 |
| 2013/0320350 A1* | 12/2013 | Haberlen | H01L 29/42316 |
| | | | 257/E21.403 |
| 2014/0001557 A1* | 1/2014 | Mishra | H01L 29/7786 |
| | | | 257/E21.409 |
| 2014/0239346 A1* | 8/2014 | Green | H01L 27/0629 |
| | | | 257/192 |
| 2014/0361342 A1* | 12/2014 | Sriram | H01L 29/7787 |
| | | | 257/194 |
| 2016/0336436 A1* | 11/2016 | Yang | H01L 29/7786 |
| 2016/0372557 A1* | 12/2016 | Liao | H01L 29/78 |
| 2017/0229567 A1* | 8/2017 | Morvan | H01L 29/4236 |
| 2018/0076310 A1* | 3/2018 | Sheridan | H01L 29/66462 |
| 2019/0140086 A1* | 5/2019 | Chikamatsu | H01L 29/0615 |
| 2020/0091331 A1* | 3/2020 | Hung | H01L 29/205 |
| 2020/0295171 A1* | 9/2020 | Hung | H01L 29/404 |
| 2021/0111254 A1* | 4/2021 | Jones | H01L 29/7786 |

* cited by examiner

SEMICONDUCTOR DEVICE WITH CONDUCTIVE ELEMENTS FORMED OVER DIELECTRIC LAYERS AND METHOD OF FABRICATION THEREFOR

TECHNICAL FIELD

Embodiments of the subject matter described herein relate generally to semiconductor devices with conductive elements and methods for fabricating such devices.

BACKGROUND

Semiconductor devices find application in a wide variety of electronic components and systems. High power, high frequency transistors find application in radio frequency (RF) systems and power electronics systems. Gallium nitride (GaN) device technology is particularly suited for these RF power and power electronics applications due to its superior electronic and thermal characteristics. In particular, the high electron velocity and high breakdown field strength of GaN make devices fabricated from this material ideal for RF power amplifiers and high-power switching applications. Field plates are used to reduce gate-drain feedback capacitance and to increase device breakdown voltage in high frequency transistors. Accordingly, there is a need for semiconductor and, in particular, GaN devices with field plates.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

In one aspect, a semiconductor device may include a semiconductor substrate that may include an upper surface and a channel, a first dielectric layer disposed over the upper surface of the semiconductor substrate, a first current-carrying electrode and a second current-carrying electrode formed over the semiconductor substrate within openings formed in the first dielectric layer, wherein the first current-carrying electrode and the second current-carrying electrode are electrically coupled to the channel. A control electrode may be formed over the semiconductor substrate and disposed between the first current-carrying electrode and the second current-carrying electrode and over the first dielectric layer, wherein the control electrode may be electrically coupled to the channel, according to an embodiment. In an embodiment, a first conductive element may be formed over the first dielectric layer, adjacent to the control electrode, and between the control electrode and the second current-carrying electrode. A second dielectric layer may be disposed over the control electrode and over the first conductive element, according to an embodiment. In an embodiment, a second conductive element may be disposed over the second dielectric layer and over the first conductive element.

In another aspect, embodiments of the inventive subject matter may include a gallium nitride heterojunction field effect transistor device. An embodiment may include a semiconductor substrate that includes a gallium nitride layer, an upper surface, and a channel. A first dielectric layer may be disposed over the upper surface of the semiconductor substrate, according to an embodiment. In an embodiment, an active region defined by an isolation region, may be formed within the semiconductor substrate. A source electrode and a drain electrode may be formed over the semiconductor substrate within openings formed in the first dielectric layer in the active region, wherein the source electrode and the drain electrode may be electrically coupled to the channel. A gate electrode may be formed over the semiconductor substrate and disposed between the source electrode and the drain electrode and over the first dielectric layer, wherein the gate electrode may be electrically coupled to the channel. According to an embodiment, a first field plate may be formed over the first dielectric layer, adjacent the gate electrode between the gate electrode and the drain electrode, forming a first metal-insulator-semiconductor region under the first field plate. A second dielectric layer may be disposed over the gate electrode and over the first field plate, according to an embodiment. In an embodiment, a second field plate may be disposed over the second dielectric layer and over the first field plate, forming a second metal-insulator-semiconductor region under the second field plate between the gate electrode and the first field plate, and a third metal-insulator-semiconductor region under the second field plate, adjacent the first field plate and between the first field plate and the drain electrode.

In still another aspect, the inventive subject matter may include a method of fabricating a gallium nitride heterojunction field effect transistor device. An embodiment of the method may include forming a semiconductor substrate that includes gallium nitride having an upper surface and a channel and forming a first dielectric layer over the upper surface of the semiconductor substrate. Embodiments of the method may further include forming a source electrode and forming a drain electrode over the semiconductor substrate within openings formed in the first dielectric layer, wherein the source electrode and the drain electrode are electrically coupled to the channel. The method may include forming a gate electrode over the semiconductor substrate between the source electrode and the drain electrode and over the first dielectric layer, according to an embodiment. In an embodiment, the method may include forming a first field plate over the first dielectric layer, adjacent the gate electrode between the gate electrode and the drain electrode, forming a second dielectric layer over the control electrode and over the first field plate, and forming a second field plate over the second dielectric layer and over the first field plate.

Figure 1:
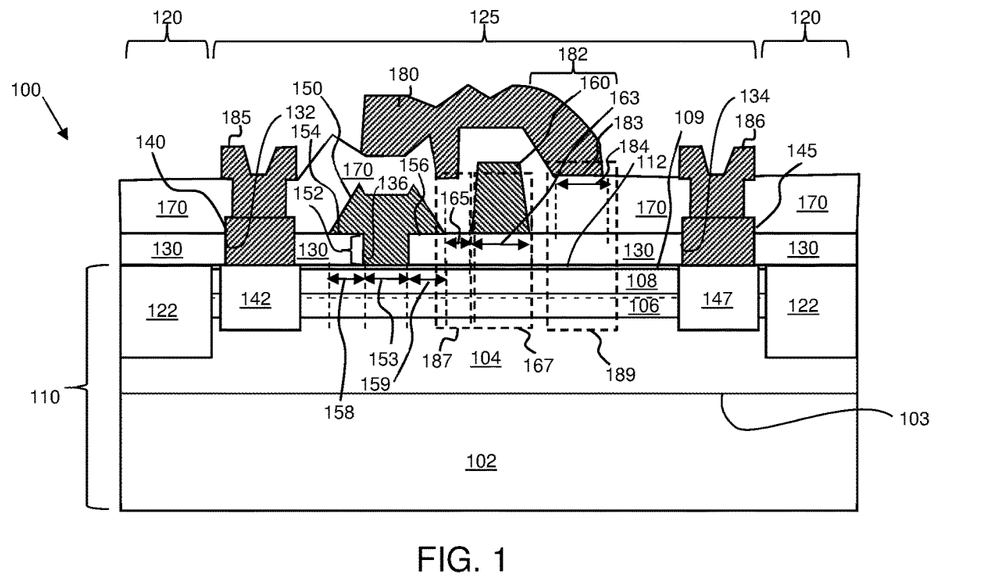
FIG. 1 is a cross-sectional, side view of an exemplary GaN heterojunction field effect transistor (HFET) in accordance with an embodiment.

FIG. 1 is a cross-sectional, side view of an exemplary GaN heterojunction field effect transistor (HFET) device 100 in accordance with an embodiment. In an embodiment, the GaN HFET device 100 may include a semiconductor substrate 110, one or more isolation regions 120, an active region 125, a first dielectric layer 130, a source electrode (generally "first current-carrying electrode") 140, a drain electrode (generally "second current-carrying electrode") 145, a gate electrode 150 (generally "control electrode"), a first field plate electrode (generally "first conductive element") 160, a second dielectric layer 170, and a second field plate 180 (generally "second conductive element"). As is described more fully below, the GaN HFET device 100 is substantially contained within the active region 125 defined by the isolation regions 120, with the first dielectric layer 130, the source electrode 140, drain electrode 145, gate electrode 150, first field plate 160, and second field plate layer 180 disposed over the semiconductor substrate 110.

In an embodiment, the semiconductor substrate 110 may include a host substrate 102, a buffer layer 104 disposed over the host substrate 102, a channel layer 106 disposed over the buffer layer 104, a barrier layer 108 disposed over the channel layer 106, and a cap layer 109 disposed over the channel layer 106. In an embodiment, the host substrate 102 may include silicon carbide (SiC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials. A nucleation layer (not shown) may be formed on an upper surface 103 of the host substrate 102 between the buffer layer 104 and the host substrate 102. In an embodiment, the nucleation layer may include AN. The buffer layer 104 may include a number of group III-N semiconductor layers and is supported by the host substrate 102. Each of the semiconductor layers of the buffer layer 104 may include an epitaxially grown group III-nitride epitaxial layer. The group-III nitride epitaxial layers that make up the buffer layer 104 may be nitrogen (N)-face or gallium (Ga)-face material, for example. In other embodiments, the semiconductor layers of the buffer layer 104 may not be epitaxially grown. In still other embodiments, the semiconductor layers of the buffer layer 104 may include Si, GaAs, InP, or other suitable materials.

In an embodiment, the buffer layer 104 may be grown epitaxially over the host substrate 102. The buffer layer 104 may include at least one AlGaN mixed crystal layer having a composition denoted by $Al_xGa_{1-x}N$ with an aluminum mole fraction, X, that can take on values between 0 and 1. The total thickness of the buffer layer 104 with all of its layers may be between about 200 angstroms and about 100,000 angstroms although other thicknesses may be used. A limiting X value of 0 yields pure GaN while a value of 1 yields pure aluminum nitride (AlN). An embodiment may include a buffer layer 104 disposed over the host substrate and nucleation layer (not shown). The buffer layer 104 may include additional $Al_xGa_{1-x}N$ layers. The thickness of the additional $Al_xGa_{1-x}N$ layer(s) may be between about 200 angstroms and about 50,000 angstroms though other thicknesses may be used. In an embodiment, the additional $Al_xGa_{1-x}N$ layers may be configured as GaN (X=0) where the $Al_xGa_{1-x}N$ is not intentionally doped (NID). The additional $Al_xGa_{1-x}N$ layers may also be configured as one or more GaN layers where the one or more GaN layers are intentionally doped with dopants that may include iron (Fe), chromium (Cr), carbon (C) or other suitable dopants that render the buffer layer 104 substantially insulating or high resistivity. The dopant concentration may be between about $10^{17}$ cm$^{-3}$ and $10^{19}$ cm$^{-3}$ though other higher or lower concentrations may be used. The additional $Al_xGa_{1-x}N$ layers may be configured with X=0.01 to 0.10 where the $Al_xGa_{1-x}N$ is NID or, alternatively, where the $Al_xGa_{1-x}N$ is intentionally doped with Fe, Cr, C, or other suitable dopant species. In other embodiments (not shown), the additional layers may be configured as a superlattice where the additional layers include a series of alternating NID or doped $Al_xGa_{1-x}N$ layers where the value of X takes a value between 0 and 1. In still other embodiments, the buffer layer 104 may also include one or more indium gallium nitride (InGaN) layers, with composition denoted $In_yGa_{1-y}N$, where Y, the indium mole fraction, may take a value between 0 and 1. The thickness of the InGaN layer(s) may be between about 50 angstroms and about 2000 angstroms, though other thicknesses may be used.

In an embodiment, a channel layer 106 may be formed over the buffer layer 104. The channel layer 106 may include one or more group III-N semiconductor layers and may be supported by the buffer layer 104. The channel layer 106 may include an $Al_xGa_{1-x}N$ layer where X takes on values between 0 and 1. In an embodiment, the channel layer 106 is configured as GaN (X=0) although other values of X may be used without departing from the scope of the inventive subject matter. The thickness of the channel layer 106 may be between about 50 angstroms and about 10,000 angstroms though other thicknesses may be used. The channel layer 106 may be NID or, alternatively, may include Si, germanium (Ge), C, Fe, Cr, or other suitable dopants. The dopant concentration may be between about $10^{15}$ cm$^{-3}$ and about $10^{19}$ cm$^{-3}$ though other higher or lower concentrations may be used. In other embodiments, the channel layer 106 may include NID or doped $In_yGa_{1-y}N$, where Y, the indium mole fraction, may take a value between 0 and 1.

A barrier layer 108 may be formed over the channel layer 106 in accordance with an embodiment. The barrier layer 108 may include one or more group III-N semiconductor layers and is supported by the channel layer 106. In some embodiments, the barrier layer 108 has a larger bandgap and larger spontaneous polarization than the channel layer 106 and, when the barrier layer 108 is in direct contact with the channel layer 106, a channel 107 is created in the form of a two-dimensional electron gas (2-DEG) within the channel layer 106 near the interface between the channel layer 106 and barrier layer 108. In addition, strain between the barrier layer 108 and channel layer 106 may cause additional piezoelectric charge to be introduced into the 2-DEG and channel 107. The barrier layer 108 may include at least one NID $Al_XGa_{1-X}N$ layer where X takes on values between 0 and 1. In some embodiments, X may take a value of 0.1 to 0.35, although other values of X may be used. The thickness of the barrier layer 108 may be between about 50 angstroms and about 1000 angstroms though other thicknesses may be used. The barrier layer 108 may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used. In an embodiment, an additional AlN interbarrier layer (not shown) may be formed between the channel layer 106 and the barrier layer 108, according to an embodiment. The AlN interbarrier layer may increase the channel charge and improve the electron confinement of the resultant 2-DEG. In other embodiments, the barrier layer 108 may include indium aluminum nitride (InAlN) layers, denoted $In_YAl_{1-Y}N$, where Y, the indium mole fraction, may take a value between about 0.1 and about 0.2 though other values of Y may be used. In the case of an InAlN barrier, the thickness of the barrier layer 108 may be between about 30 angstroms and about 2000 angstroms though other thicknesses may be used. In the case of using InAlN to form the barrier layer 108, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

In an embodiment illustrated in FIG. 1, a cap layer 109 may be formed over the barrier layer 108. The cap layer 109 presents a stable surface for the semiconductor substrate 110 and serves to protect the surface of the semiconductor substrate 110 from chemical and environmental exposure incidental to wafer processing. The cap layer 109 may include one or more group III-N semiconductor layers and is supported by the barrier layer 108. In an embodiment, the cap layer 109 is GaN. The thickness of the cap layer 109 may be between about 5 angstroms and about 100 angstroms though other thicknesses may be used. The cap layer 109 may be NID or, alternatively, may include Si, Ge, C, Fe, Cr, or other suitable dopants. The dopant concentration may be between about $10^{16}$ cm$^3$ and $10^{19}$ cm$^{-3}$ though other higher or lower concentrations may be used. Without departing from the scope of the inventive subject matter, it should be appreciated that the choice of materials and arrangement of layers to form semiconductor substrate 110 is exemplary. It should be appreciated that the inclusion of the host substrate 102, the buffer layer 104, the channel layer 106, the barrier layer 108, and the cap layer 109 into the semiconductor substrate 110 is exemplary and that the function and operation of the various layers may be combined and may change depending on the materials used in any specific embodiment. For example, in some embodiments (not shown), the cap layer 109 may be omitted. In other embodiments using N-polar materials (not shown), the channel layer 106 may be disposed over the barrier layer 108 to create a 2-DEG and channel 107 directly beneath an optional cap 109 and the gate electrode 150. Still further embodiments may include semiconductor layers formed from materials including GaAs, gallium oxide ($Ga_2O_3$) aluminum gallium arsenide (AlGaAs), indium gallium arsenide (InGaAs), and aluminum indium arsenide (AlInAs) to form the semiconductor substrate 110.

One or more isolation regions 120 may be formed in the semiconductor substrate 110 to define an active region 125 above and along the upper surface 103 of the host substrate 102, according to an embodiment. The isolation regions 120 may be formed via an implantation procedure configured to damage the epitaxial and/or other semiconductor layers to create high resistivity regions 122 of the semiconductor substrate 110 rendering the semiconductor substrate 110 high resistivity or semi-insulating in those high resistivity regions 122 while leaving the crystal structure intact in the active region 125. In other embodiments, the isolation regions 120 may be formed by removing one or more of the epitaxial and/or other semiconductor layers of the semiconductor substrate 110 rendering the remaining layers of the semiconductor substrate 110 semi-insulating and leaving behind active region 125 "mesas" surrounded by high resistivity or semi-insulating isolation regions 120 (not shown). In still other embodiments, the isolation regions 120 may be formed by removing one or more of the epitaxial and/or other semiconductor layers of the semiconductor substrate 110 and then using ion implantation to damage and further enhance the semi-insulating properties of the remaining layers of the semiconductor substrate 110 and leaving behind active region 125 "mesas" surrounded by high resistivity or semi-insulating isolation regions 120 that have been implanted (not shown). In an embodiment, a first dielectric layer 130 may be formed over the active region 125 and isolation regions 120. In an embodiment, the first dielectric layer 130 may be formed from one or more suitable materials including silicon dioxide ($SiO_2$), silicon nitride (SiN), silicon oxynitride (SiON), aluminum oxide ($Al_2O_3$), aluminum nitride (AlN), and hafnium oxide ($HfO_2$), though other substantially insulating materials may be used. In an embodiment, the first dielectric layer 130 may have a thickness of between 200 angstroms and 1000 angstroms. In other embodiments, the first dielectric layer 130 may have a thickness of between 50 angstroms and 10000 angstroms, though other thicknesses may be used.

In an embodiment, the source electrode 140 and the drain electrode 145 may be formed over and contact source and drain regions 142, 147 formed in semiconductor substrate 110 in the active region 125. The source electrode 140 and the drain electrode 145 may be formed inside a source opening 132 and a drain opening 134 formed in the first dielectric layer 130 and may be formed from one or more conductive layers. In some embodiments, ion implantation may be used to form ohmic contact to the channel 107 to create source and drain regions 142, 147. In an embodiment, the one or more conductive layers used to form source and drain electrodes 140, 145 may include Ti, Au, Al, molybdenum (Mo), nickel (Ni), Si, Ge, platinum (Pt), or other suitable materials. In an embodiment, the source electrode 140 and the drain electrode 145 may be formed over and in contact with the cap layer 109. In other embodiments (not shown), one or both of the source electrode 140 and the drain electrode 145 may be recessed through the cap layer 109 and extend partially through the barrier layer 108. In an embodiment, the source electrode 140 and the drain electrode 145 may be formed from a multi-layer stack. In an embodiment, the multi-layer stack used to form source electrode 140 and drain electrode 145 may include an adhesion layer and one or more layers, that when annealed, allows an ohmic contact to form between the channel 107 and the source and drain regions 142, 147. In an embodiment, the adhesion layer may include titanium (Ti), tantalum (Ta), silicon (Si), or other suitable materials. In an embodiment, the adhesion layer may have a work function that is below 4.5 electron-volts.

In an embodiment, the gate electrode 150 may be formed over the semiconductor substrate 110 in the active region 125. The gate electrode 150 may include a vertical stem 152, a first protruding region 154 coupled to the vertical stem 152 over the first dielectric layer 130 and toward the source electrode, according to an embodiment. In an embodiment a second protruding region 156 may couple to the vertical stem 152 and may be formed over the first dielectric layer 130 and toward the drain electrode 145, according to an embodiment. In an embodiment, the gate electrode 150 may be electrically coupled to the channel 107 through the cap layer 109 and barrier layer 108. Changes to the electric potential applied to the gate electrode 150 may shift the quasi Fermi level for the barrier layer 108 with respect to the quasi Fermi level for the channel layer 106 and thereby modulate the electron concentration in the channel 107 within the semiconductor substrate 110 under the gate electrode 150. Schottky materials such as Ni, Pd, Pt, iridium (Jr), and Copper (Cu), may be combined with one or more of low stress conductive materials such as Au, Al, Cu, poly Si, or other suitable material(s) in a metal stack to form a gate electrode 150 for a low-loss Schottky gate electrode 150 electrically coupled to channel 107, according to an embodiment. In an embodiment, the gate electrode 150 may be formed, wherein the vertical stem 152 is formed within a gate opening 136 in the first dielectric layer 130.

In an embodiment, the gate electrode 150 may be characterized by the gate length 153 within the gate opening 136 and first and second protruding region lengths 158 and 159 where the first and second protruding regions 154 and 156 overlay the first dielectric layer 130. In an embodiment, the gate length 153 may be between about 0.1 microns and about 1 micron. In other embodiments, the gate length 153 may be between about 0.05 microns and about 2 microns, though other suitable dimensions may be used. In an embodiment, the first protruding region length 158 may be between about 0.1 microns and about 0.5 microns. In other embodiments, the first protruding region length 158 may be between about 0.05 microns and 2 microns, though other suitable dimensions may be used. In an embodiment, a second protruding region length 159 may be between about 0.1 microns and about 0.5 microns. In other embodiments, the second protruding region length 159 may be between 0.1 microns and 2 microns, though other suitable lengths may be used.

Without departing from the scope of the inventive subject matter, numerous other embodiments may be realized. The exemplary embodiment of FIG. 1 depicts the gate electrode 150 as T-shaped with a vertical stem 152 and first and second protruding regions 154 and 156 disposed over the first dielectric layer 130. In other embodiments, the gate electrode 150 may be a square shape with no protruding regions (e.g. 154 and 156) over the first dielectric layers 130. In other embodiments (not shown), the gate electrode 150 may be recessed through the cap layer 109 and extend partially into the barrier layer 108, increasing the electrical coupling of the gate electrode 150 to the channel 107 through the barrier layer 108. In other embodiments (not shown), the cap layer 109 may be omitted and the gate electrode 150 may contact the barrier layer directly (not shown). In still other embodiments, the gate electrode 150 may be disposed over a gate dielectric that is formed between the gate electrode 150 and the semiconductor substrate 110 to form a metal insulator semiconductor field effect transistor (MISFET) device (not shown).

In an embodiment, the first field plate 160 may be formed over the first dielectric layer, adjacent the gate electrode 150, and between the gate electrode 150 and the drain electrode 145. The first field plate 160 may be characterized by a first field plate length 163 and by a field plate to gate distance 165 from the gate electrode 150, according to an embodiment. In an embodiment, the first field plate length 163 may be between about 0.2 microns and about 0.8 microns. In other embodiments, the first field plate length 163 may be between 0.1 microns and 2 microns, though other suitable lengths may be used. The first field plate to gate distance 165 may be between about 0.2 microns and about 1 micron. In other embodiments, the first field plate to gate distance 165 may be between 0.1 microns and 2 microns, though other suitable lengths may be used. A first metal-insulator-semiconductor region 167 may be created by the first field plate 160, the underlying first dielectric layer 130 and the semiconductor substrate 110. In an embodiment, the first metal-insulator-semiconductor region 167 acts as part of the active device and has a first threshold voltage, dependent on the thickness of dielectric layer 130 and the amount of charge in channel 107. In an embodiment the first threshold voltage may be between −5 volts and −15 V. In other embodiments, the threshold voltage may be between −4 volts and −30 volts. In an embodiment, the second field plate 180 reduces the electric field between the gate electrode 150 and the drain electrode 145.

In an embodiment, the second dielectric layer 170 may be disposed over the first dielectric layer 130, the source and drain electrodes 140 and 145, the gate electrode 150, and the first field plate 160. In an embodiment, the second dielectric layer 170 may include one or more of SiN, $SiO_2$, AN, $HfO_2$, $Al_2O_3$, spin on glass, or other suitable insulating materials. In an embodiment, the third second layer 170 may have a thickness of between about 500 angstroms and about 5000 angstroms. In other embodiments, the second dielectric layer 170 may have a thickness between about 100 angstroms and about 20000 angstroms.

In an embodiment, the second field plate 180 may be disposed over the second dielectric layer 160 and over the gate electrode 150 and first field plate 160. In an embodiment, the second field plate may be formed on the side of the gate electrode 150 facing the drain electrode 145. In an embodiment, the second field plate 180 may be coupled to the source electrode 140. In other embodiments (not shown), the second field plate 180 may be disposed over the second dielectric layer 170, over the gate electrode 150, and first field plate 160, and may wrap around the gate electrode 150 and first field plate 160 on the sides of the gate electrode 150 that face the source electrode 140 and the drain electrode 145, and extend to and contact the source electrode 140.

In an embodiment, the second field plate creates a second metal-insulator-semiconductor region 187 and a third metal-insulator-semiconductor region 189 that includes the second field plate, the second dielectric layer 170, the first dielectric layer 130, and the semiconductor substrate 110. The second and third metal-insulator-semiconductor regions 187, 189 acts as parts of the active device and have a second and third threshold voltages, dependent on the thicknesses of dielectric layer 130 and second dielectric layer 170, the amount of charge in channel 107, and interface charges that may exist between the dielectric layers themselves and between first dielectric layer 130 and the semiconductor substrate 110. In an embodiment, the second and third threshold voltages may be between −20 volts and −80 V. In other embodiments, the threshold voltage may be between −10 volts and −200 volts. In an embodiment, the second field plate 180 reduces the electric field and coupling and associated gate-drain capacitance between the gate electrode 150 and the drain electrode 145. In an embodiment, a field plate drain extension 182 may extend from the portion of the second field plate adjacent the first field plate 160 facing the drain electrode 145 toward the drain electrode 145 by a second field plate drain extension length 184. In other embodiments, the lower surface 183 of the second field plate drain extension 182 may be in contact with the first dielectric layer 130 of the gate electrode 150 where the second protruding region 156 contacts the first dielectric layer 130. In still other embodiments, the lower surface 183 of the second field plate drain extension 182 may be above the second protruding region 156 of the gate electrode 150 where the second protruding region 156 contacts the first dielectric layer 130. In an embodiment, the second field plate drain extension length 184 characterizes the overlap of the second field plate 180 over the second dielectric layer 170 and the first dielectric layer 130. In an embodiment, the second field plate drain extension length 184 may be between about 0.2 microns and 2 microns. In other embodiments, the second field plate drain extension length 184 may be between about 0.1 and about 10 microns. Without departing from the scope of the inventive subject matter, the second field plate extension length 184 may have other longer or shorter lengths. In an embodiment, the second field plate 180 may be coupled to the same potential as the source electrode 140 or to a ground potential. In other embodiments, the second field plate 180 may be coupled to the gate electrode 150 (not shown). In other, further embodiments, the second field plate 180 may be coupled to an arbitrary potential (not shown). In an embodiment, source and drain metallization 185, 186 to the source and drain electrodes may be formed using the same conductive layer(s) as the second field plate 180.

In an embodiment, GaN HFET device 100 may be configured as a transistor finger wherein the source electrode 140, drain electrode 145, gate electrode 150, first field plate electrode 160, and second field plate electrode 180 may be configured as elongated elements forming a gate finger (not shown). GaN transistor device 100 may be defined, in part, by isolation regions 130 in which a gate width of the gate finger (i.e., a dimension extending along an axis perpendicular to the plane of GaN transistor device 100 of FIG. 1 is significantly larger than the gate length 153 of the gate electrode 150 (i.e., a dimension extending along an axis that is perpendicular to the gate width). In some embodiments, the gate width may be between about 50 microns and about 500 microns. In other embodiments, the gate width may be between about 5 microns and about 1000 microns. In some embodiments, it is desired to minimize signal attenuation along the gate finger to maintain a constant potential along first field plate 160 and second field plate 180 by electrically coupling first field plate 160 and second field plate 180 to a potential at one or more points. In an embodiment, the first field plate 160 and the second field plate 180 may be electrically coupled to the same potential as the source electrode 140. First field plate 160 may be connected to the source electrode 140 using connections formed from extensions of the conductive material used to form first field plate 160 at one or more ends of device fingers in the isolation region 125 to the source electrode 140 (not shown). In some embodiments, conductive regions "straps" that electrically connect the second field plate 180 to the source electrode 140 may be formed periodically along the device finger using the same conductive layer used to form the second field plate 180. In an embodiment, these conductive straps may be between 0.1 and 5 microns wide and may be placed at a strap-to-strap spacing along the device finger. In an embodiment, the strap-to-strap spacing may be between about 25 microns and about 100 microns, according to an embodiment, though other shorter or longer strap-to-strap spacings may be used. The strap-to-strap spacing may be between about 5 microns and about 200 microns, according to an embodiment, though other shorter or longer strap-to-strap spacings may be used. In other embodiments (not shown), connections of the second field plate 180 to the source electrode 140 may be accomplished either by connections from the second field plate 180 to the source electrode 140 using the same metal used to form second field plate 180 or by using another metal layer (e.g. an interconnect layer) at the end of the device finger in the isolated region 125. In still other embodiments, connections between the source electrode 140 and the second field plate 180 may be accomplished by forming the second field plate 180 as a solid, continuous connection to the source electrode 140 (not shown).

Figure 2:
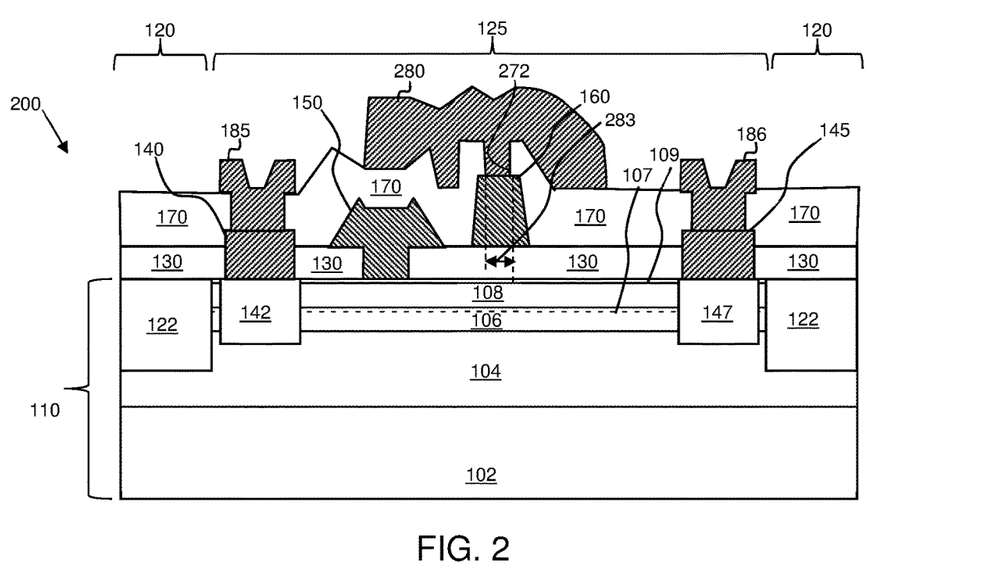
FIG. 2 is a cross-sectional, side view of an exemplary GaN heterojunction field effect transistor (HFET) in accordance with an embodiment.

FIG. 2 is a cross-sectional, side view of an exemplary GaN heterojunction field effect transistor (HFET) 200 in accordance with an embodiment of the inventive subject matter. In an embodiment, the GaN HFET device 200 may include a semiconductor substrate 110, an isolation region 120, an active region 125, a first dielectric layer 130, a source electrode 140, a drain electrode 145, a gate electrode 150, a first field plate 160, a second dielectric layer 170, and a second field plate 280. As is described in connection with the GaN HFET device 100 of FIG. 1, the GaN HFET device 200 may be substantially contained within the active region 125 defined by the isolation region 120, with the first dielectric layer 130, the source electrode 140, drain electrode 145, gate electrode 150, first field plate 160, second dielectric layer 170, and second field plate 180 disposed over the semiconductor substrate 110. In an embodiment, a field plate opening 272 may be created in the second dielectric layer 170 over the first field plate 160. The field plate opening 272 may allow the second field plate 280 to contact the first field plate, according to an embodiment. In some embodiments, the field plate opening 272 is continuous along the entire gate width of GaN HFET device 200. In other embodiments, the field plate opening 272 is formed in distinct regions along the unit gate width (not shown). In these embodiments, a constant connection-to-connection distance may be a fixed value of between about 5 microns and about 500 microns, though other shorter or longer values for the connection-to-connection distance may be used.

Figure 3:
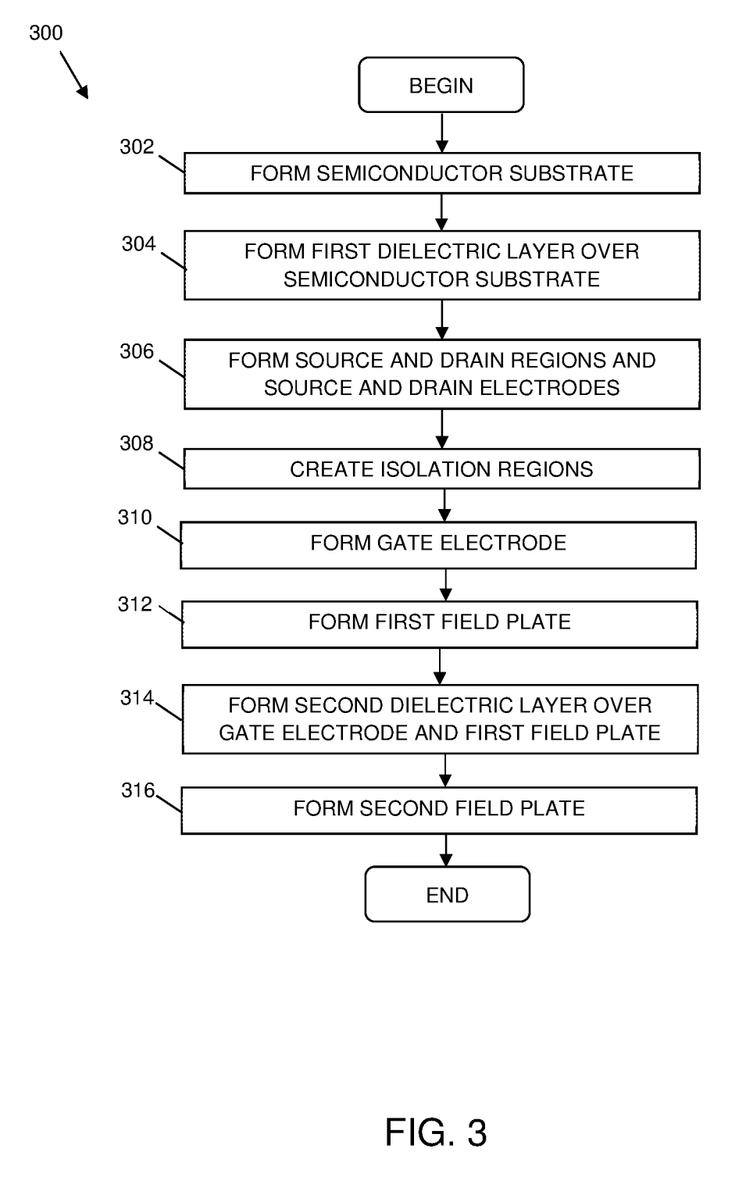
FIG. 3 is a process flow diagram describing a method for fabricating the GaN heterojunction field effect transistor (HFET) devices of FIGS. 1-2 in accordance with an embodiment.

The flowchart 300 of FIG. 3 describes embodiments of methods for fabricating semiconductor devices (e.g. GaN HFET devices 100, 200 FIGS. 1-2). FIG. 3 should be viewed alongside FIGS. 3, 4, 5, 6A, 6B, 6C, 6D, 7, 8, 9A, 9B, 10A, and 10B which illustrate cross-sectional, side views of a series of fabrication steps for producing the semiconductor devices of FIGS. 1 and 2, in accordance with an example embodiment.

Figure 4:
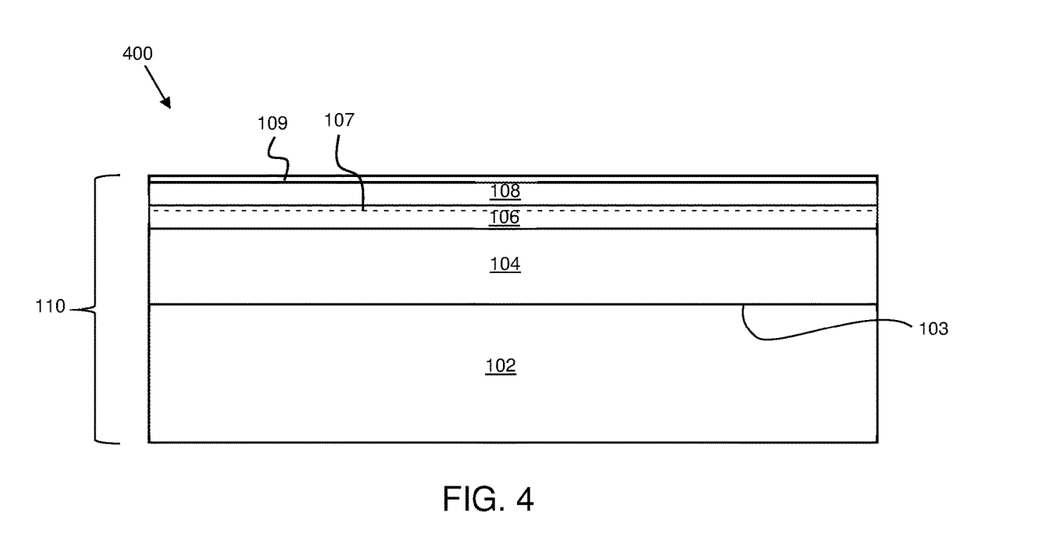
FIG. 4 is a cross-sectional, side view of a fabrication step for producing a GaN HFET device, in accordance with embodiments of the method of fabrication.

In block 302 of FIG. 3, and as depicted in the step 400 of FIG. 4, an embodiment of the method may include forming a semiconductor substrate 110. In an embodiment, the step 400 may include providing a host substrate 102 and forming number of semiconductor layers on or over the host substrate 102. In an embodiment, the host substrate 102 may include SiC, or may include other materials such as sapphire, Si, GaN, AN, diamond, poly-SiC, silicon on insulator, GaAs, InP, or other substantially insulating or high resistivity materials. Forming the semiconductor layers may include forming a nucleation layer (not shown) on or over an upper surface 103 of the host substrate 102, forming a buffer layer 104 on or over the nucleation layer, forming the channel layer 106 on or over the buffer layer 104, forming the barrier layer 108 on or over the channel layer 106, and forming the cap layer 109 on or over the barrier layer 108. As discussed previously, embodiments of the buffer layer 104, the channel layer 106, the barrier layer 108, and the cap layer 109 may include materials selected from AlN, GaN, AlGaN, InAlN, InGaN, or other suitable materials. The semiconductor layers 104, 106, 108, and 109 may be grown using one of metal-organo chemical vapor deposition (MOCVD), molecular beam epitaxy (MBE), hydride-vapor phase epitaxy (HVPE) or a combination of these techniques, although other suitable techniques may alternatively be used. Semiconductor substrate 110 results.

Figure 5:
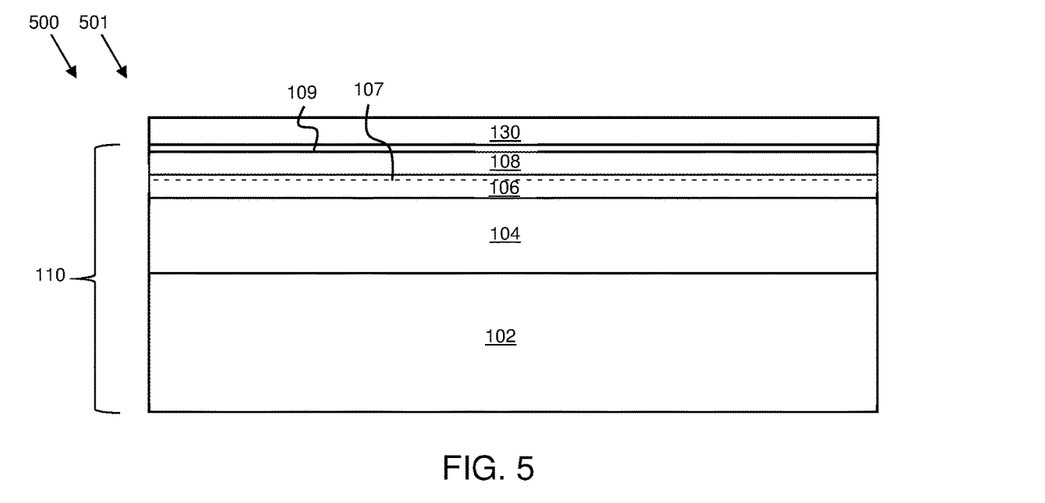
FIG. 5 is a cross-sectional, side view of a fabrication step for producing a GaN HFET device, in accordance with embodiments of the method of fabrication.

In block 304 of FIG. 3, and as depicted in a step 500 of FIG. 5, an embodiment of the method may include forming a first dielectric layer 130 on or over the semiconductor substrate 110. As discussed previously, in an embodiment, the first dielectric layer 130 may include materials selected from SiN, $Al_2O_3$, $SiO_2$, AlN, and $HfO_2$. The first dielectric layer 130 may be formed using one or more of low pressure chemical vapor deposition (LPCVD), atomic layer deposition (ALD), sputtering, physical vapor deposition (PVD), plasma-enhance chemical vapor deposition (PECVD), MOCVD, MBE, inductively coupled plasma (ICP) deposition, electron-cyclotron resonance (ECR) deposition, or other suitable techniques. In other embodiments, the first dielectric layer 130 may be formed, in-situ, immediately after and in the same chamber or deposition system (e.g. MOCVD or MBE) as the growth of the semiconductor layers of semiconductor substrate 110. Structure 501 results.

In block 306 of FIG. 3, and as depicted in steps 600, 602, 604, and 606 of FIGS. 6A, 6B, 6C, and 6D an embodiment of the method may include forming source and drain regions 142 and 147 in the first dielectric layer 130 and forming the source and drain electrodes 140 and 145. Referring again to FIG. 6A and step 600, an embodiment of the method may include patterning an implant mask 610 and implanting a dopant species 620 through an opening 615 in implant mask 610 into the semiconductor substrate to form implant regions 630 within the semiconductor substrate 110. Once the implant mask layer is patterned, a dopant species may be implanted through the implant mask layer and into the semiconductor substrate. In an embodiment, Si, Ge, 0, or other suitable n-type dopant may be implanted into the semiconductor substrate through the implant mask. Structure 601 results.

Figure 6A:
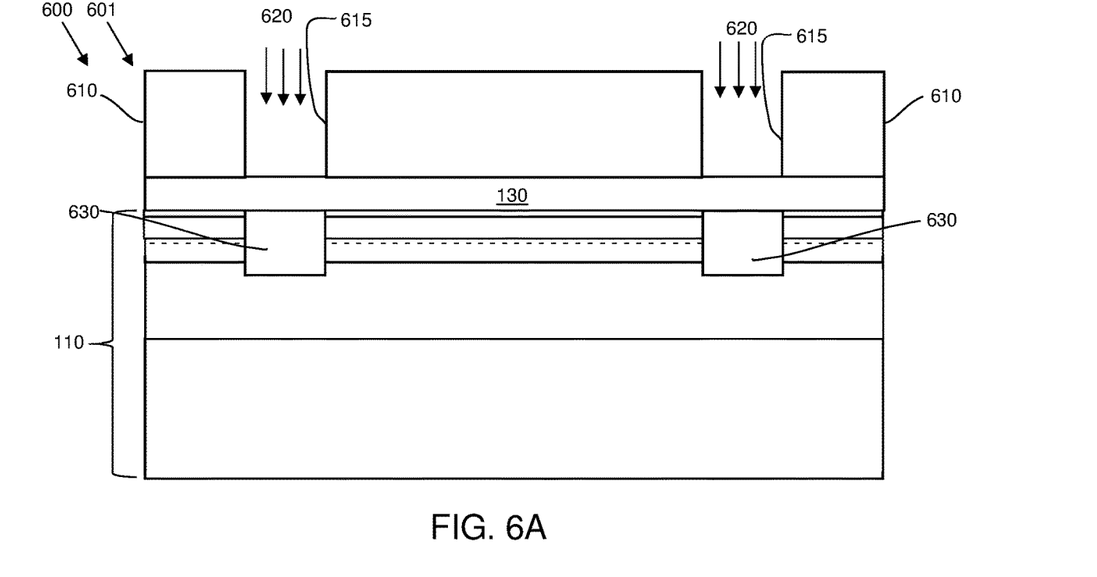
FIGS. 6A, 6B, 6C, and 6D are cross-sectional, side views of fabrication steps for producing a GaN HFET device, in accordance with embodiments of the method of fabrication.
Figure 6B:
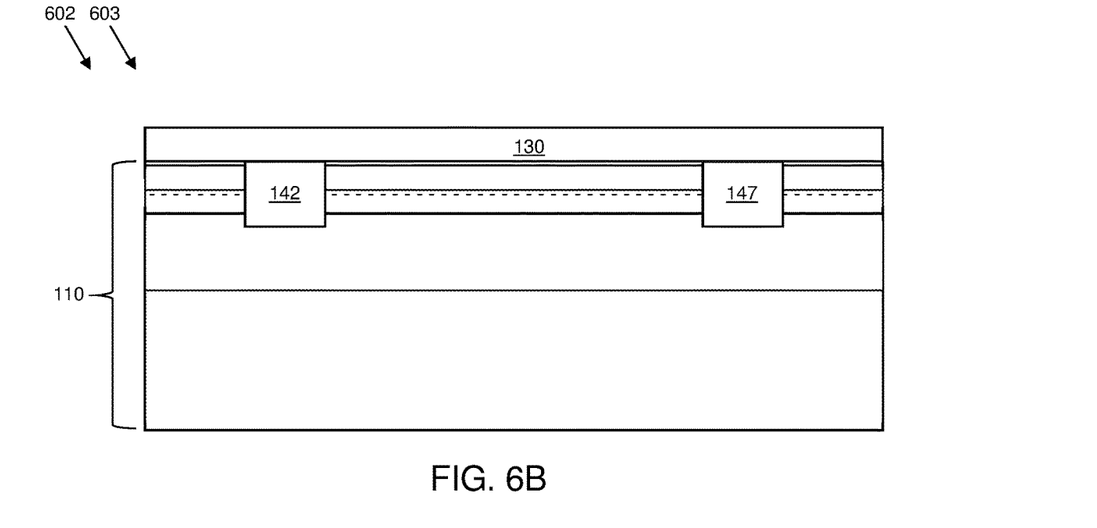

Referring again to block 306 of FIG. 3 and step 602 and now to FIG. 6B, an embodiment of the method may include activating the dopant species to complete the formation of the source and drain regions 142 and 147 within the semiconductor substrate 110, and then removing the implant mask 610. According to an embodiment, the dopant species may be activated by annealing the semiconductor substrate 110 using an activation anneal at a temperature of between about 900° C. and about 1500° C. Structure 603 results.

Figure 6C:
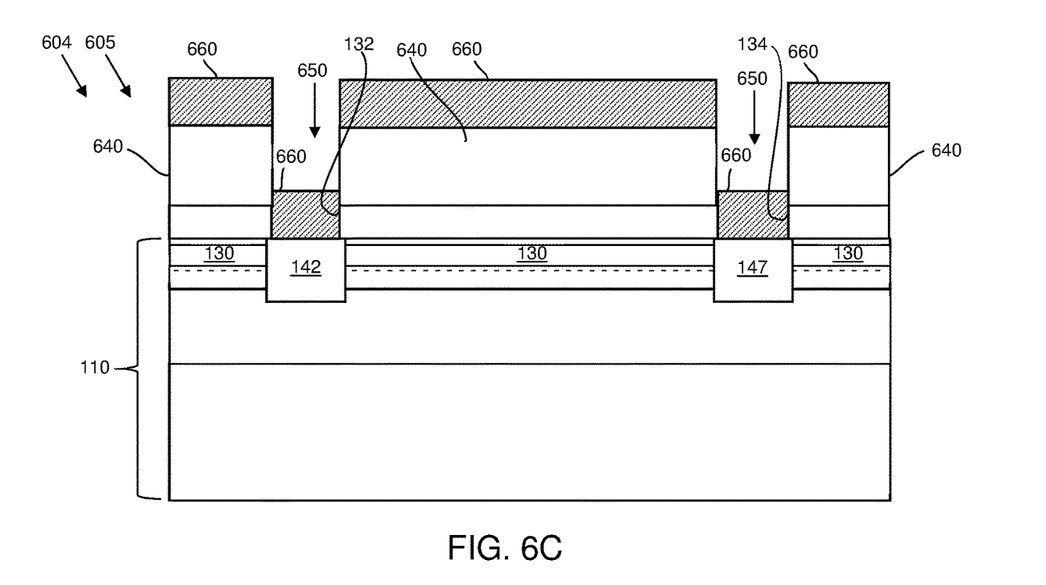

In an embodiment, and referring to FIG. 6C, forming the source and drain openings 132, 134 and may include dispensing a resist layer 640 over the first dielectric layer 130 and patterning the resist layer 640 to form resist openings 650. In an embodiment, source and drain electrodes 140 and 145 may be created by etching through the first dielectric layer 130 in areas exposed by the resist openings 650 to form source and drain openings 132 and 134. Etching the first dielectric layer 130 (e.g. SiN) may include etching using one or more dry and/or wet etch technique(s) such as reactive ion etching (RIE), ICP etching, ECR etching, and wet chemical etching according to an embodiment. Suitable wet-etch chemistries may include hydrofluoric acid (HF), buffered HF, buffered oxide etch (BOE), phosphoric acid ($H_3PO_4$), or other suitable wet etchant(s), according to an embodiment. These dry etching techniques may use one or more of sulphur hexafluoride ($SF_6$), di-carbon hexafluoride ($C_2F_6$), carbon tetrafluoride ($CF_4$), tri-fluoromethane ($CHF_3$) or other suitable chemistry, to remove SiN, according to an embodiment. In an embodiment, the etchant used to etch the first dielectric 130 may selectively etch a portion of the first dielectric layer 130 and then stop on an etch stop layer (not shown) (e.g. $Al_2O_3$ or AlN). In an embodiment, etching the etch stop layer (e.g. an $Al_2O_3$ or AlN etch stop layer) may include wet and/or dry etch techniques. In other embodiment(s), dry etching of the etch stop layer (e.g. an AlN or $Al_2O_3$ etch stop) may include dry etching using suitable techniques (e.g. RIE, ICP, or ECR) in conjunction chlorine-based chemistry such as $Cl_2$, boron trichloride ($BCl_3$), or other suitable dry-etch chemistries. Structure 605 results.

Referring again to block 306 of FIG. 3, and step 604 of FIG. 6C, an embodiment of the method may include forming and patterning source and drain electrodes 140 and 145 in source and drain openings 132 and 134. In an embodiment, the method may include depositing a metal layer 660 over the resist layer 640 and into the source and drain openings 132 and 134 formed by etching the first dielectric layer 130 exposed in the resist openings 650 formed in the resist layer 640. In an embodiment, the metal layer 660 may contain one or more metal layers that include Ti, Ta, Al, Mo, Au, Ni, Si, Ge, platinum (Pt), tungsten (W), and or other refractory metals, that when annealed, will form an ohmic contact with the source and drain regions 142, 147. In an embodiment, the metal layer 660 may include a stack deposited on the substrate that includes Ti, Al, and Au. In an embodiment, to form the metal layer 660, a Ti layer may be disposed over the semiconductor substrate 110 in the openings 650, an Al layer may be disposed over the Ti layer, a barrier layer formed from Mo or other suitable barrier metal such as Ni or tungsten, may be disposed over the Al layer, and an Au layer may be disposed over the barrier layer. In an embodiment, the metal layer 660 may be deposited by evaporation. In other embodiments, the metal layer 660 may be deposited by sputtering, PVD, or other suitable deposition techniques. In an embodiment, the Ti layer may be between about 100 angstroms and 200 angstroms thick, the Al layer may be between about 600 angstroms and 1500 angstroms thick, the Mo layer may be between about 200 angstroms and 700 angstroms thick, and the Au layer may be between about 300 angstroms and 1000 angstroms thick. In other embodiments, other metals may be substituted (e.g. Ni or Pt may be added with substituted for Mo or Ta may be added to or substituted for Ti) and other thicknesses may be used. In an embodiment, the resist layer 640 may be configured in a lift-off profile, wherein the openings of the resist layer 640 have a retrograde profile, allowing the metal not deposited into resist openings 650 to "lift off" when dissolved in solvents. In other embodiments (not shown), the source and drain electrodes 140 and 145 may be patterned by dry etching. Structure 605 results.

Figure 6D:
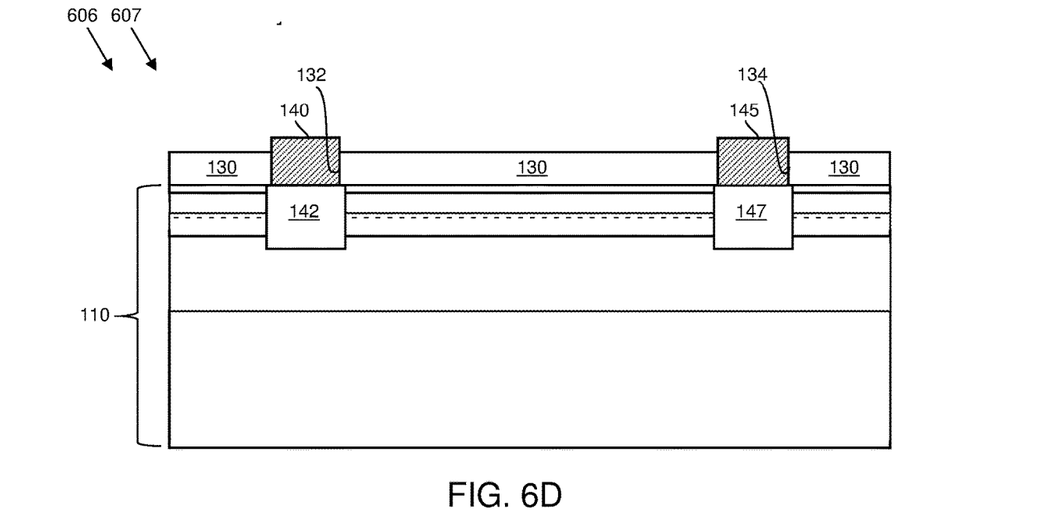

Referring again to block 306 of FIG. 3, and as depicted in step 606 of FIG. 6D, an embodiment of the method may include annealing source and drain electrodes 140 and 145 in source and drain openings 132 and 134. In an embodiment, annealing the source and drain electrodes 140 and 145 may include an annealing step used to alloy the metal layer 660 of FIG. 6C resulting in ohmic contacts to the source and drain regions 142 and 147 formed in semiconductor substrate 110 that form source and drain electrodes 140 and 145. In an embodiment, the annealing step may be accomplished by rapid thermal annealing. In an embodiment, the metal layer 660 of FIG. 6C that remains in source and drain openings 132 and 134 of FIG. 6C may be alloyed at a temperature of between about 500 degrees Celsius and 700 degrees Celsius for between about 15 seconds and about 60 seconds. In other embodiments the metal layer 660 of FIG. 6C may be annealed at between about 400 degrees Celsius and about 800 degrees Celsius for between about 10 seconds and about 600 seconds, though other higher or lower temperatures and times may be used. In an embodiment, the metal stack used to form metal layer 660 (e.g. Ti, Al, Mo, and Au) will mix to form the source and drain electrodes 140 and 145. Structure 607 results.

Without departing from the scope of the inventive subject matter, drain and source electrodes 140 and 145 may be formed using alloyed ohmic contacts (not shown). In these embodiments, source and drain regions may not be formed. Rather, ohmic contact to semiconductor substrate 110 is accomplished by high temperature annealing of the ohmic metals (e.g. Ti, Al, Mo, Au may be used to form metal stack 660).

Figure 7:
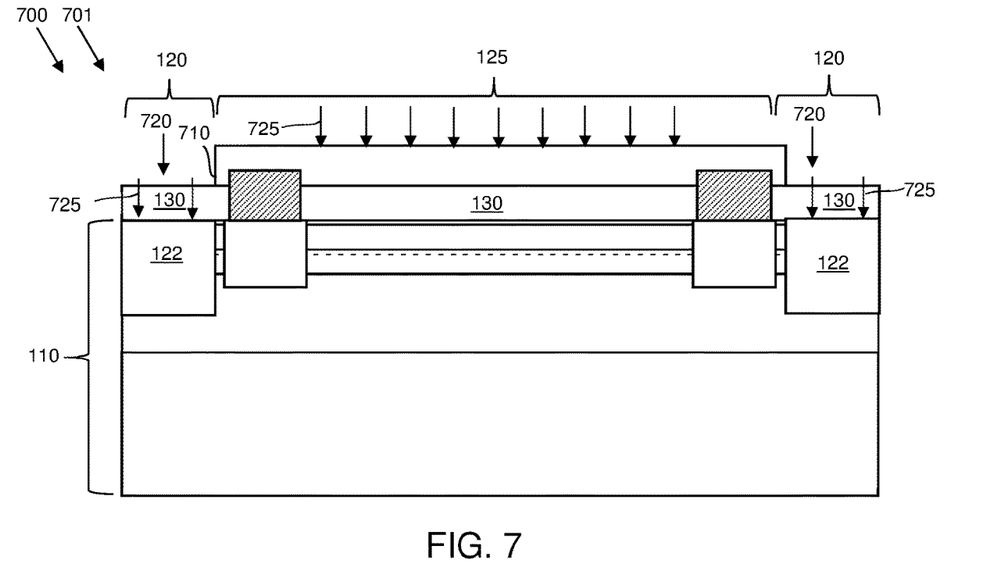
FIG. 7 is a cross-sectional, side view of a fabrication step for producing a GaN HFET device, in accordance with embodiments of the method of fabrication.

Referring again to block 308 and step 700 of FIG. 7, and in an embodiment, the method may include creating isolation regions 120. Forming the isolation regions 120 may include dispensing and patterning a resist mask 710 over the first dielectric layer 130 and then defining openings 720 in the resist mask 710. Using ion implantation, a dopant species 725 (e.g. one or more of oxygen, nitrogen, boron, and helium) may be driven into the semiconductor substrate 110 to create high resistivity regions 122. In an embodiment, the energy and dose of the implant may be configured to create a sufficient amount of damage in the crystal structure of the semiconductor substrate 110 such that the semiconductor substrate is substantially high resistivity or semi-insulating within the high resistivity regions 122 of the isolation regions 120. In other embodiments (not shown), forming the isolation regions 120 may include, first, etching some or all of the semiconductor layers in the semiconductor substrate 110 and then ion implanting to enhance the resistivity in the remaining semiconductor layers and/or the host substrate 102. Structure 701 results.

Figure 8:
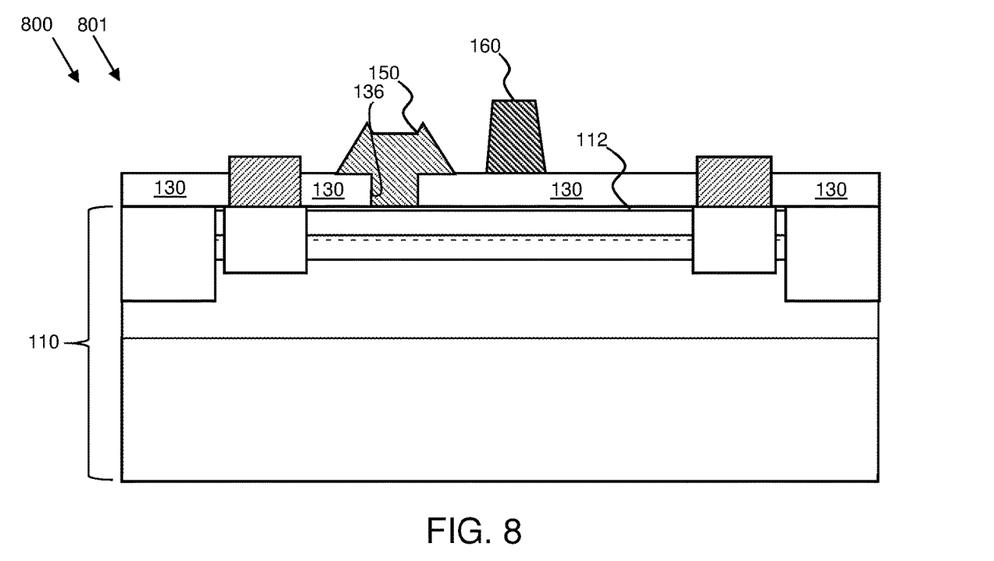
FIG. 8 is a cross-sectional, side view of a fabrication step for producing a GaN HFET device, in accordance with embodiments of the method of fabrication.

Referring next to blocks 310 and 312 of FIG. 3 and step 800 in FIG. 8, in an embodiment, forming the gate electrode and first field plate of the transistor devices 100, 200 of FIGS. 1 and 2 may include forming a gate opening 136 in the first dielectric layer 130. In an embodiment, forming the gate electrode 150 and the first field plate 160 may include depositing and patterning a conductive material to form the gate electrode 150 and the first field plate 160. In the embodiment shown, gate electrode 150 and first field plate 160 may be fabricated using the same conductive (e.g. metal) layer(s). In other embodiments (not shown), separate metal layers and processing steps may be used to form gate electrode 150 and first field plate 160.

In an embodiment of the method, photo resist or e-beam resist (not shown) may be patterned to create an opening in the resist in a manner analogous to the description given for FIG. 6C and step 604. Using the opening created in the resist layer, the first dielectric layer 130 may be etched to form gate opening 136, thus exposing a portion of the upper substrate surface 112, according to an embodiment. In an embodiment, one or more layers of gate metal may then be deposited over the opening in the resist to form the gate electrode 150 over the upper substrate surface 112 of the substrate 110 and the first field plate 160 over the first dielectric layer 130. Depositing gate metal to form the gate electrode 150 and first field plate 160 may include depositing a multi-layer stack that includes one or more metal layers and/or other suitable materials. A first layer within the multi-stack used to form the gate electrode 150 and the first field plate 160 may include Ti, Ni, Pt, Cu, palladium (Pd), Cr, W, Iridium (Ir), poly-silicon or other suitable materials. The first layer may be between about 30 and about 2,000 angstroms in thickness, although other thickness values may be used. One or more layers that act as conductive layers may be deposited over the first layer to form the gate electrode 150 and first field plate 160, according to an embodiment. The conductive layer(s) may include Au, Ag, Al, Cu, Ti or other substantially conductive materials. The conductive layer(s) may be between about 50 and about 20,000 angstroms in thickness, although other thickness values may be used. Optionally, one or more barrier metal layers may be placed between the first layer and the conductive layer(s), where the barrier metal layer(s) may include materials such as Ni, Pt, Cu, Pd, Cr, W, Jr or other substantially refractive materials that act as a barrier between the portion of the first layer that contacts the substrate 110 and first dielectric layer 130 and the conductive layer(s). The barrier metal layer(s) may be between about 50 and about 10,000 angstroms in thickness, although other thickness values may be used. In an embodiment, the various layers used to form gate electrode 150 and first field plate 160 may be deposited by evaporation, sputtering, PVD, ALD, or other suitable deposition technique(s).

It should be appreciated that other methods may be used to form the gate electrode 150 and first field plate 160 without departing from the scope of the inventive subject matter. In methods for fabricating these other embodiments (not shown), the gate electrode 150 and first field plate 160 may be formed by patterning a first resist layer to form an opening, etching the first dielectric layer 130 to create an opening exposing the upper substrate surface 212 of the substrate 110, and then removing the first resist layer. In this embodiment, forming the gate electrode 150 and first field plate 160 includes patterning an opening in a second resist layer aligned over the opening created in the first dielectric layer 130 to expose the upper substrate surface 112. The opening in the second resist layer may be smaller or larger than the opening in the first dielectric layer 122. In other embodiments, gate metal may be disposed over a gate dielectric such as $SiO_2$, $HfO_2$, $Al_2O_3$, or similar materials (not shown). The gate dielectric may be deposited over and above the upper substrate surface 112, according to an embodiment. In still other embodiments, the gate electrode 150 and first field plate 160 may be formed using gate metal that is deposited over the substrate 110 and is then defined by patterning photo resist, and then etching the gate metal. In whichever embodiment or method is selected to form gate electrode 150 and first field plate 160, gate metal may then be deposited using the methods described in connection with the formation of gate electrode 150 shown in FIG. 8.

Figure 9A:
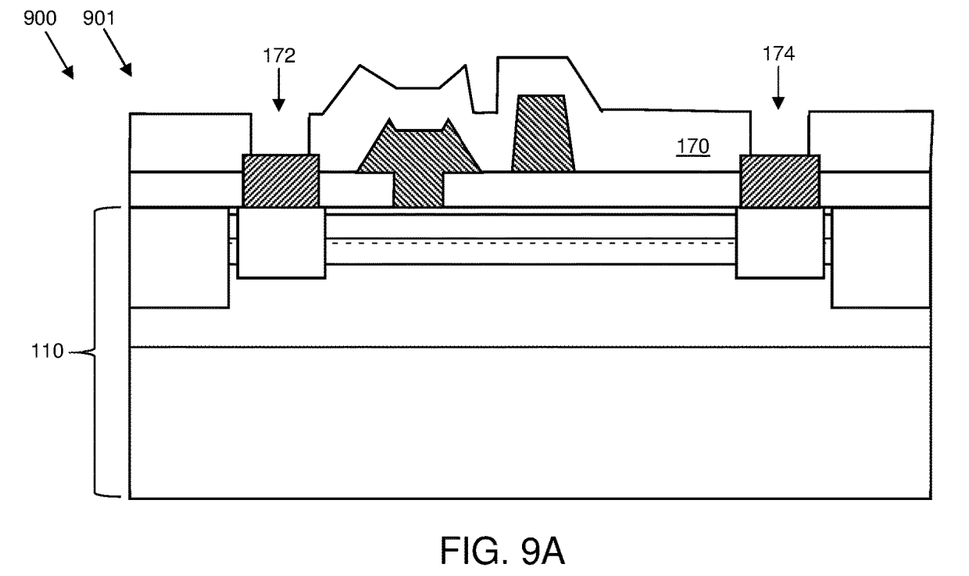
FIGS. 9A and 9B are cross-sectional, side views of fabrication steps for producing a GaN HFET device, in accordance with embodiments of the method of fabrication.
Figure 9B:
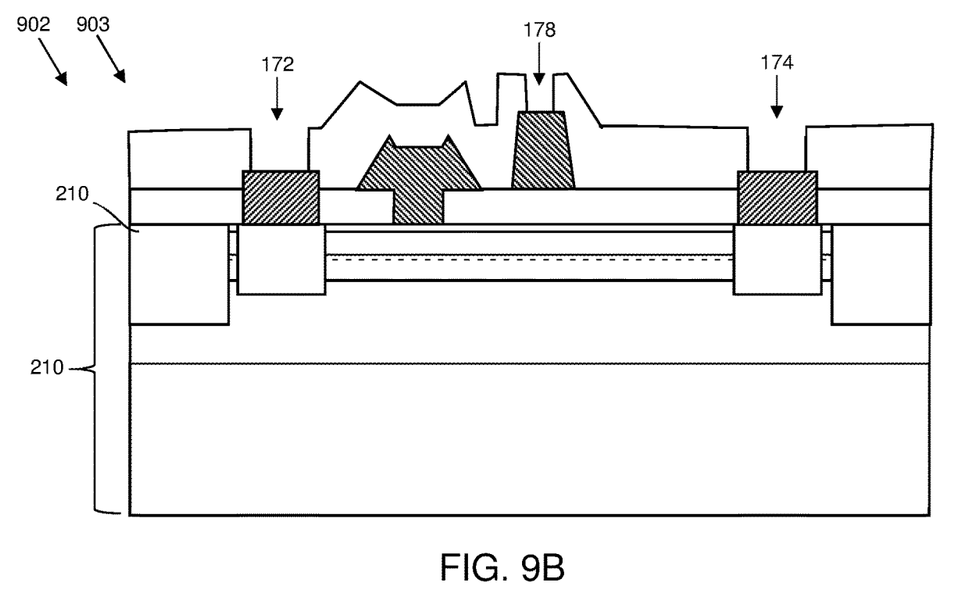

Referring now to block 314 of FIG. 3, FIGS. 9A and 9B and steps 900, 902 the method of fabricating the transistor device 100 and 200 of FIGS. 1 and 2 may further include depositing and patterning the second dielectric layer 170 over the source and drain electrodes 140,145, the gate electrode 150, the first field plate layer and first dielectric layer 130 of structure 801 of FIG. 8, according to an embodiment. In an embodiment, the second dielectric layer 170 may include one of SiN, $Al_2O_3$, $SiO_2$, $HfO_2$, ITO, diamond, poly-diamond, AN, BN, SiC, or a combination of these or other insulating materials. The total thickness of the layers used to form the second dielectric layer 170 may be between about 100 and about 10,000 angstroms in thickness, although other thickness values may be used. The second dielectric layer 170 may be deposited using LPCVD, PECVD, sputtering, PVD, ALD, Cat-CVD, HWCVD, ECR CVD, CVD, ICP-CVD, a combination of these or other suitable dielectric deposition technique(s).

In an embodiment, additional process steps to etch the second dielectric layer 170 may be analogous to those used to etch the first dielectric layer 130 as described in connection with FIG. 6C, step 604, and may be used to create openings 172, 174, and 178. In an embodiment, the second dielectric layer 170 may be patterned by placing a resist layer (not shown) over second dielectric layer 170, and patterning the resist layer to form openings to portions of the second dielectric layer 170 over source and drain electrodes 140, 145. The second dielectric layer 170 may then be etched through the openings in the resist layer using a technique analogous to the etching of first dielectric layer 130, as described in connection with FIG. 6C, step 604. Accordingly, openings 172 and 174 are created in structure 901 of FIG. 9A and openings 172, 174, and 178 are formed in structure 903 of FIG. 9B. Structures 901 and 903 result.

Figure 10A:
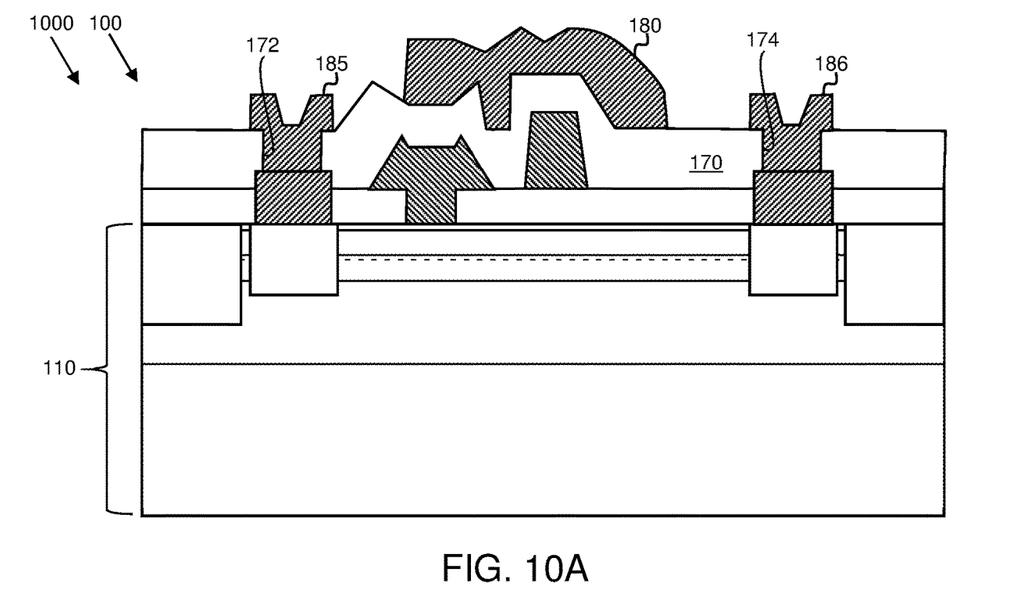
FIGS. 10A and 10B are cross-sectional, side views of fabrication steps for producing a GaN HFET device, in accordance with embodiments of the method of fabrication.
Figure 10B:
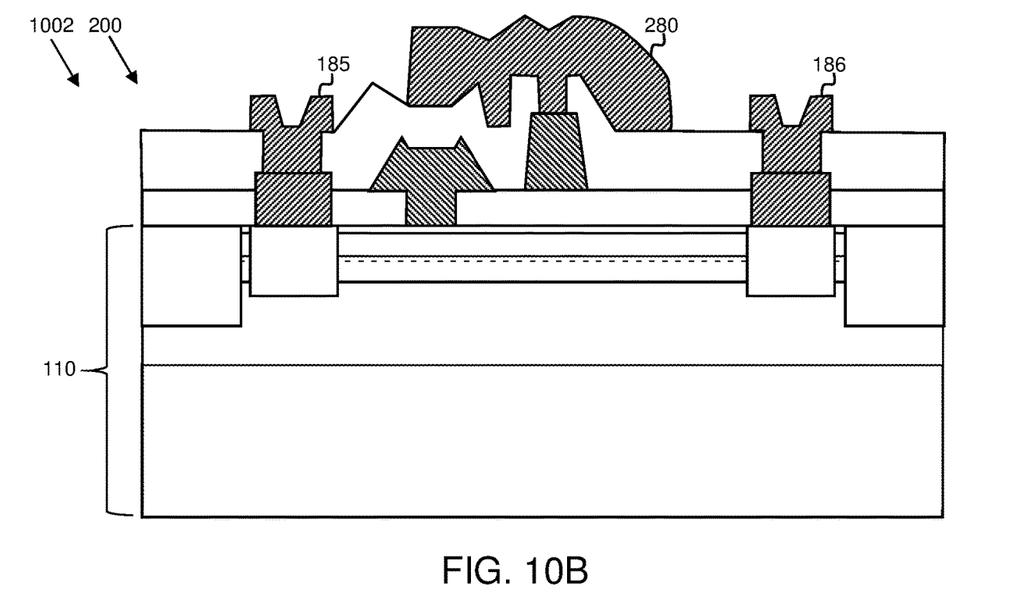

Referring now to block 316 of FIG. 3, FIGS. 10A and 10B and steps 1000, 1002 the method of fabricating the transistor structures of device 200 of FIG. 2 may further include depositing and patterning the second field plate 180, 280 and source and drain metallization 185, 186 over the second dielectric layer 170 and source and drain electrodes 140, 145 of structure 901 and 903 of FIG. 9, according to an embodiment. In an embodiment, forming and patterning the second field plate 180, 280 and source and drain metallization 185, 186 may be accomplished by applying and patterning resist layers (not shown), depositing the second field plate 180, source and drain metallization 185, 186 and removing the resist layers and overlying metal outside the second field plate 180, 280, source and drain metallization 185, 186, and other structures (e.g. interconnects, not shown) in a lift-off configuration, analogous to step 700 in FIG. 7. In an embodiment, the second field plate metal is formed by depositing one or more adhesion and conductive metal layers into openings (not shown) patterned into resist layers applied to the partially-formed device as described above. In an embodiment, the adhesion layer(s) may be deposited first, followed by deposition of the conductive layer(s). In an embodiment, the adhesion and conductive layers may be deposited in the same deposition step. The adhesion layer(s) may include one of Ti, Ni, Cr or other suitable adhesion layer material(s). The adhesion layer(s) may be between about 50 and about 2,000 angstroms in thickness, although other thickness values may be used. The conductive layer(s) may include Cu, Au, Al, or Ag, although other suitable materials may be used. The conductive layer(s) may be between about 200 and about 40,000 angstroms in thickness, although other thickness values may be used. The adhesion and conductive layers used to form the second field plate metal 280 may be deposited over and in contact with the second dielectric layer 170 and the first field plate 160, according to an embodiment. In an embodiment, the adhesion layer(s) and conductive layer(s) may be formed by sputtering, evaporation, or electro-plating. In an embodiment, after applying and patterning resist layers and depositing the second field plate 180, 280, the resist layers and metals deposited over the resist layers and not included with the portions of the second field plate metal that contact the second dielectric layer 170, first field plate 160 are removed using solvents analogous to those described in conjunction step 604 in FIG. 6C. In other embodiments, the second field plate metal may be formed by depositing adhesion and conductive layers that are then patterned by suitable dry or wet chemical etching techniques. Completed transistor devices 100, 200 result.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

What is claimed is:
1. A semiconductor device comprising:
a semiconductor substrate that includes an upper surface and a channel;
a first dielectric layer disposed over the upper surface of the semiconductor substrate;
a first current-carrying electrode and a second current-carrying electrode formed over the semiconductor substrate within openings formed in the first dielectric layer, wherein the first current-carrying electrode and the second current-carrying electrode are electrically coupled to the channel;
a control electrode formed over the semiconductor substrate and disposed between the first current-carrying electrode and the second current-carrying electrode and over the first dielectric layer, wherein the control electrode is electrically coupled to the channel;
a first conductive element formed over the first dielectric layer, electrically insulated from and adjacent to the control electrode, formed between the control electrode and the second current-carrying electrode;
a second dielectric layer disposed over the control electrode and over the first conductive element; and
a second conductive element disposed over the second dielectric layer and over the first conductive element, wherein a portion of the second conductive element is below an upper surface of the first conductive element between the control electrode and the first conductive element.

2. The semiconductor device of claim 1, wherein the first conductive element is electrically coupled to the second conductive element.

3. The semiconductor device of claim 1, wherein first current-carrying electrode is configured as a source electrode, wherein second current-carrying electrode is configured as a drain electrode, and the control electrode is configured as a gate electrode.

4. The semiconductor device of claim 3, wherein a first metal-insulator-semiconductor region is formed under the first conductive element.

5. The semiconductor device of claim 4, wherein a second metal-insulator-semiconductor region is formed under the second conductive element and between the gate electrode and the first conductive element.

6. The semiconductor device of claim 5, wherein a third metal-insulator-semiconductor region is formed under the second conductive element and between the drain electrode and the first conductive element.

7. The semiconductor device of claim 6, wherein the first conductive element is configured as a first field plate and the second conductive element is configured as configured as a second field plate.

8. The semiconductor device of claim 7, wherein the gate electrode and the first field plate are formed from the same material.

9. The semiconductor device of claim 7, wherein the first field plate and second field plate are at the same potential as the source electrode.

10. The semiconductor device of claim 7, wherein a lateral distance between the gate electrode and the first field plate are between 0.2 microns and 1 micron.

11. The semiconductor device of claim 1, wherein the semiconductor substrate includes a group-III nitride material.

12. A gallium nitride heterojunction field effect transistor device comprising:
   a semiconductor substrate that includes a gallium nitride layer, an upper surface, and a channel;
   a first dielectric layer disposed over the upper surface of the semiconductor substrate;
   an active region defined by an isolation region, formed within the semiconductor substrate;
   a source electrode and a drain electrode formed over the semiconductor substrate within openings formed in the first dielectric layer in the active region, wherein the source electrode and the drain electrode are electrically coupled to the channel;
   a gate electrode formed over the semiconductor substrate and disposed between the source electrode and the drain electrode and over the first dielectric layer, wherein the gate electrode is electrically coupled to the channel;
   a first field plate formed over the first dielectric layer, electrically insulated from and adjacent the gate electrode between the gate electrode and the drain electrode, forming a first metal-insulator-semiconductor region under the first field plate;
   a second dielectric layer disposed over the gate electrode and over the first field plate; and
   a second field plate disposed over the second dielectric layer and over the first field plate, wherein a portion of the second field plate is below an upper surface of the first field plate between the gate electrode and the first field plate, forming a second metal-insulator-semiconductor region under the second field plate between the gate electrode and the first field plate, and a third metal-insulator-semiconductor region under the second field plate, adjacent the first field plate and between the first field plate and the drain electrode.

13. A method of fabricating a gallium nitride heterojunction field effect transistor device comprising:
   forming a semiconductor substrate that includes a gallium nitride layer, an upper surface, and a channel;
   forming a first dielectric layer over the upper surface of the semiconductor substrate;
   forming a source electrode and forming a drain electrode over the semiconductor substrate within openings formed in the first dielectric layer, wherein the source electrode and the drain electrode are electrically coupled to the channel;
   forming a gate electrode over the semiconductor substrate between the source electrode and the drain electrode and over the first dielectric layer;
   forming a first field plate over the first dielectric layer, electrically insulated from and adjacent the gate electrode between the gate electrode and the drain electrode;
   forming a second dielectric layer over the gate electrode and over the first field plate; and
   forming a second field plate over the second dielectric layer and over the first field plate, wherein a portion of the second field plate is below an upper surface of the first field plate between the gate electrode and the first field plate.

14. The method of claim 13, further comprising forming an active region by defining an isolation region within the semiconductor substrate.

15. The method of claim 13, wherein forming the gate electrode and forming the field plate electrode are accomplished using a same conductive layer.

16. The method of claim 13, wherein forming the source electrode and drain electrode includes forming ohmic contact regions that define a source region and a drain region in the semiconductor substrate.

17. The method of claim 13, further comprising forming openings over the source electrode and drain electrode in the second dielectric layer.

* * * * *